(12) United States Patent
Joo

(10) Patent No.: US 10,797,170 B2
(45) Date of Patent: Oct. 6, 2020

(54) SEMICONDUCTOR DEVICE AND MANUFACTURING METHOD THEREOF

(71) Applicants: Hyundai Motor Company, Seoul (KR); Kia Motors Corporation, Seoul (KR)

(72) Inventor: NackYong Joo, Hanam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/203,105

(22) Filed: Nov. 28, 2018

(65) Prior Publication Data

US 2020/0111903 A1 Apr. 9, 2020

(30) Foreign Application Priority Data

Oct. 5, 2018 (KR) .......................... 10-2018-0118905

(51) Int. Cl.

| | |
|---|---|
| *H01L 29/78* | (2006.01) |
| *H01L 29/739* | (2006.01) |
| *H01L 29/16* | (2006.01) |
| *H01L 21/02* | (2006.01) |
| *H01L 29/08* | (2006.01) |
| *H01L 29/423* | (2006.01) |

(52) U.S. Cl.
CPC .... *H01L 29/7813* (2013.01); *H01L 21/02236* (2013.01); *H01L 29/0865* (2013.01); *H01L 29/0882* (2013.01); *H01L 29/1608* (2013.01); *H01L 29/4236* (2013.01); *H01L 29/7397* (2013.01)

(58) Field of Classification Search
CPC ........... H01L 29/7813; H01L 21/02236; H01L 29/1608; H01L 29/7397; H01L 29/0865; H01L 29/0882; H01L 29/4236; H01L 27/14679; H01L 29/66431; H01L 29/66462; H01L 29/66893–66924; H01L 29/7832; H01L 29/8086; H01L 2924/13062; H01L 29/1058; H01L 29/1066; H01L 27/098
See application file for complete search history.

(56) References Cited

U.S. PATENT DOCUMENTS

| | | | |
|---|---|---|---|
| 6,262,470 B1 * | 7/2001 | Lee .................... | H01L 29/66348 257/328 |
| 6,566,708 B1 * | 5/2003 | Grover .................. | H01L 29/402 257/330 |
| 8,415,671 B2 | 4/2013 | Zhang | |
| 9,647,106 B2 | 5/2017 | Masuda | |
| 2014/0159147 A1 * | 6/2014 | Sawada ............... | H01L 29/7827 257/330 |
| 2016/0064537 A1 * | 3/2016 | Okawara ............. | H01L 29/7397 257/139 |

* cited by examiner

*Primary Examiner* — Cuong B Nguyen
(74) *Attorney, Agent, or Firm* — Slater Matsil, LLP

(57) ABSTRACT

A semiconductor device according to an exemplary embodiment of the present invention includes an n− type epitaxial layer disposed on a first surface of a substrate; a p type region disposed on the n− type epitaxial layer, an n+ type region disposed on the p type region, a gate disposed on the n− type epitaxial layer, an oxidation film disposed on the gate, a source electrode disposed on the oxidation film and the n+ type region, and a drain electrode disposed on a second surface of the substrate. The gate includes a PN junction portion.

19 Claims, 12 Drawing Sheets

SEMICONDUCTOR DEVICE AND MANUFACTURING METHOD THEREOF

CROSS-REFERENCE TO RELATED APPLICATIONS

This application claims priority to Korean Patent Application No. 10-2018-0118905, filed in the Korean Intellectual Property Office on Oct. 5, 2018, which application is hereby incorporated herein by reference.

TECHNICAL FIELD

The present invention relates to a semiconductor device and a manufacturing method thereof.

BACKGROUND

A power semiconductor device specifically requires low on resistance or low saturation voltage in order to make a very large current flow and decrease power loss in an electric conduction state. Further, the power semiconductor device is basically required to have a characteristic, that is, a high breakdown voltage characteristic, by which the power semiconductor device is resistible to a reverse-directional high voltage of a PN junction applied to both ends of the power semiconductor device in an off state or at the off moment of a switch.

A metal oxide semiconductor field effect transistor (MOSFET) among the power semiconductor devices is a most generally used transistor in a digital circuit and an analog circuit.

In the meantime, in order to decrease on resistance and increase current density, a trench gate MOSFET, in which a JFET region of a planar gate MOSFET is removed, is researched.

In the case of the trench gate MOSFET, after a trench is formed, a gate insulating layer is formed on a floor surface and a lateral surface of the trench. In this case, an electric field is concentrated to the gate insulating layer disposed at a corner of the trench, so that the gate insulating layer may be broken during an operation of a semiconductor device.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to relax an electric field concentrated to a gate insulating layer in a trench gate metal oxide semiconductor field effect transistor (MOSFET). An exemplary embodiment of the present invention provides a semiconductor device. An n− type epitaxial layer is disposed on a first surface of a substrate. A p type region disposed on the n− type epitaxial layer. An n+ type region is disposed on the p type region. A gate is disposed on the n− type epitaxial layer. An oxidation film is disposed on the gate. A source electrode is disposed on the oxidation film and the n+ type region. A drain electrode is disposed on a second surface of the substrate. The gate includes a PN junction portion.

The gate may include a first gate, and a second gate disposed on the first gate, the first gate may include n type poly-crystalline silicon, and the second gate may include p type poly-crystalline silicon.

The first gate may be in contact with the second gate, and the PN junction portion may be disposed in a surface, in which the first gate is in contact with the second gate.

A boundary of a lateral surface of the first gate may be the same as a boundary of a lateral surface of the second gate.

The second gate may cover a lateral surface of the first gate.

The semiconductor device may further include: a trench disposed in the n− type layer; and a gate insulating layer disposed within the trench, in which the first gate may be is in contact with the gate insulating layer disposed in a lower surface of the trench.

An extension line of an upper surface of the first gate may be disposed below a lower surface of the p type region.

The first gate may be disposed while being extended from a lateral surface to a lower surface of the trench.

The first gate may be in contact with the gate insulating layer disposed in the lower surface and the lateral surface of the trench.

The semiconductor device may further include a p+ type region disposed on the p type region and spaced apart from a lateral surface of the trench.

The substrate may be an n+ type silicon carbide substrate.

Another exemplary embodiment of the present invention provides a method of manufacturing a semiconductor device, the method including: sequentially forming an n− type epitaxial layer, a p type region, and an n+ type region on a first surface of a substrate; forming a trench by etching the n− type epitaxial layer, the p type region, and the n+ type region; forming a gate insulating layer within the trench; forming a gate on the gate insulating layer; forming an oxidation film on the gate; forming a source electrode disposed on the oxidation film and the n+ type region; and forming a drain electrode disposed on a second surface of the substrate, in which the gate includes a PN junction portion.

The forming of the gate may include: forming a gate material layer on the gate insulating layer; forming a first gate by etching the gate material layer; and forming a second gate on the first gate.

According to the exemplary embodiments of the present invention, the gate disposed within the trench includes the PN junction portion, so that it is possible to relax an electric field concentrated to the gate insulating layer.

Accordingly, a breakdown voltage of the semiconductor device may be improved.

Further, according to the relaxation of the electric field concentrated to the gate insulating layer, durability of the gate insulating layer may be improved.

DETAILED DESCRIPTION OF ILLUSTRATIVE EMBODIMENTS

Figure 1:
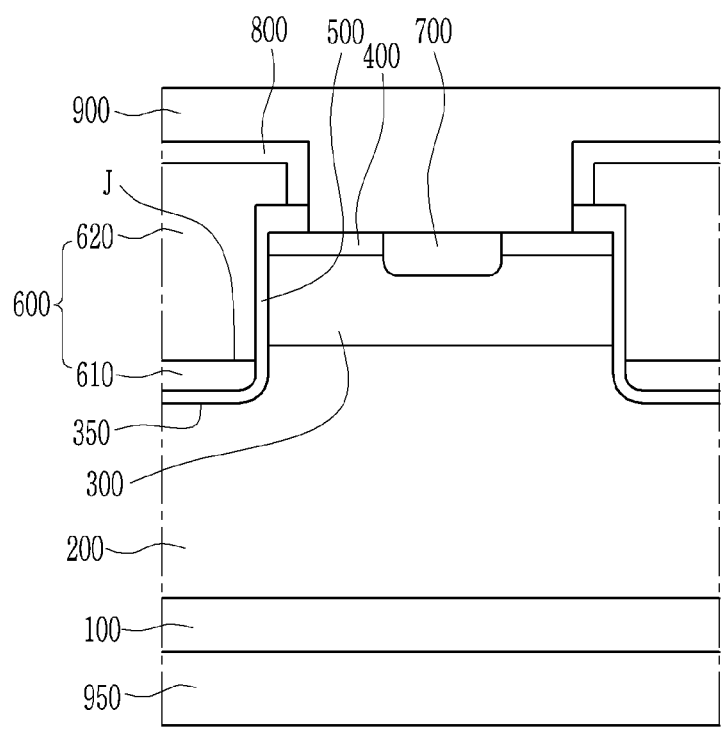
FIG. 1 is a diagram schematically illustrating an example of a cross-section of a semiconductor device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

In addition, the size and thickness of each configuration shown in the drawings are arbitrarily shown for understanding and ease of description, but the present invention is not limited thereto. In the drawings, the thickness of layers, films, panels, regions, etc., are exaggerated for clarity. In the drawings, for understanding and ease of description, the thickness of some layers and areas is exaggerated.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "on" or "above" a portion serving as a reference means positioning on or below the portion serving as the reference, but does not essentially mean positioning "on" or "above" based on a direction opposite to a gravity direction.

In addition, unless explicitly described to the contrary, the word "comprise" and variations such as "comprises" or "comprising", will be understood to imply the inclusion of stated elements but not the exclusion of any other elements.

Further, throughout the specification, "on the plane" means the case where a target portion is viewed from a top side, and "cross-sectional view" means the case where a cross-section of a target portion obtained by vertically cutting the target portion is viewed from the side.

FIG. 1 is a diagram schematically illustrating an example of a cross-section of a semiconductor device according to an exemplary embodiment of the present invention.

Referring to FIG. 1, a semiconductor device according to an exemplary embodiment of the present invention includes a substrate 100, an n− type layer 200, a p type region 300, a trench 350, an n+ type region 400, a gate 600, a p+ type region 700, a source electrode 900, and a drain electrode 950.

The substrate 100 may be an n+ type silicon carbide substrate.

The n− type layer 200 is disposed on a first surface of the substrate 100, and the p type region 300 is disposed on the n− type layer 200. The n+ type region 400 and the p+ type region 700 are disposed on the p type region 300. Herein, a thickness of the p+ type region 700 may be larger than a thickness of the n+ type region 400.

The trench 350 penetrates the p type region 300 and the n+ type region, and is disposed in the n− type layer 200. Accordingly, the p type region 300 and the n+ type region are disposed on a lateral surface of the trench 350. The p+ type region 700 is spaced apart from the lateral surface of the trench 350, and the n+ type region is disposed between the p+ type region 700 and the lateral surface of the trench 350.

A gate insulating layer 500 is disposed within the trench 350. The gate insulating layer 500 may include silicon oxide ($SiO_2$).

The gate 600 is disposed on the gate insulating layer 500. The trench 350 may be filled with the gate 600, and a part of the gate 600 may protrude to the outside of the trench 350.

The gate 600 includes a first gate 610 and a second gate 620. The first gate 610 is in contact with the gate insulating layer 500 disposed in a lower surface of the trench 350, and the second gate 620 is disposed on the first gate 610 and is in contact with the first gate 610. A part of the second gate 620 may protrude to the outside of the trench 350. In this case, an extension line of an upper surface of the first gate 610 may be disposed below a lower surface of the p type region 300 in order not to affect a threshold voltage determined by the p type region 300, the gate insulating layer 500, and the second gate 620.

The first gate 610 includes n type poly-crystalline silicon, and the second gate 620 includes p type poly-crystalline silicon. Accordingly, the gate 600 includes a PN junction portion J. The PN junction portion J is disposed within the trench 350, and is formed in a surface, in which the first gate 610 is in contact with the second gate 620.

An oxidation film 800 is disposed on the gate 600. The oxidation film 800 covers a lateral surface of the protruding gate 600. That is, the oxidation film 800 is disposed on the second gate 620 and covers a lateral surface of the second gate 620. The oxidation film 800 may include a silicon oxide ($SiO_2$).

A source electrode 900 is disposed on the n+ type region 400, the p+ type region 700, and the oxidation film 800, and a drain electrode 950 is disposed on a second surface of the substrate 100. Herein, the second surface of the substrate 100 indicates a surface opposite to the first surface of the substrate 100. The source electrode 900 and the drain electrode 950 may include ohmic metal.

As described above, the gate 600 within the trench 350 includes the PN junction portion J, so that an electric field is distributed to the gate insulating layer 500 and the PN junction portion J of the gate 600 in an off state of the semiconductor device. Accordingly, the electric field applied to the gate insulating layer 500 is relaxed, so that a breakdown voltage of the semiconductor device may be improved. Further, according to the relaxation of the electric field applied to the gate insulating layer 500, durability of the gate insulating layer 500 may be improved.

Then, an operation of the semiconductor device of FIG. 1 will be described with reference to FIGS. 2 and 3.

Figure 2:
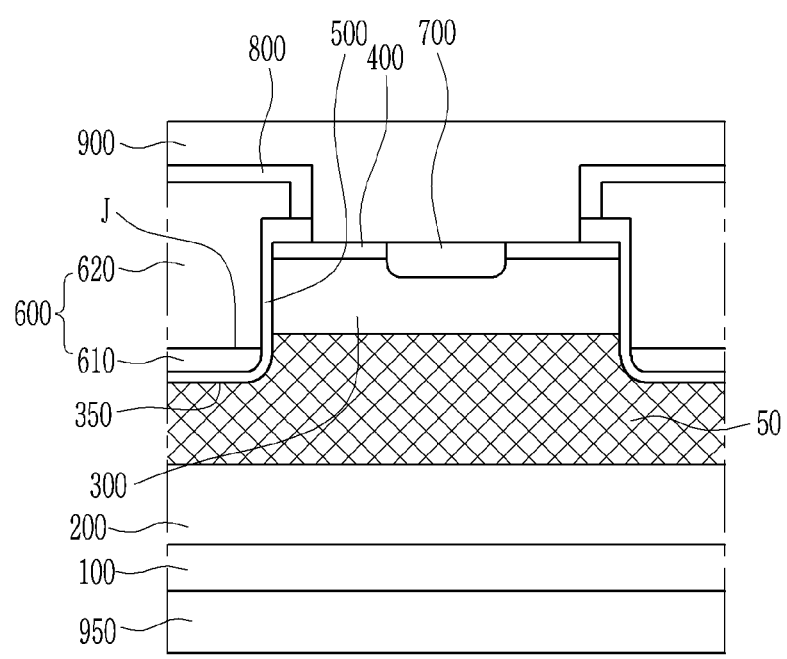
FIG. 2 is a diagram schematically illustrating an off state of the semiconductor device of FIG. 1.
Figure 3:
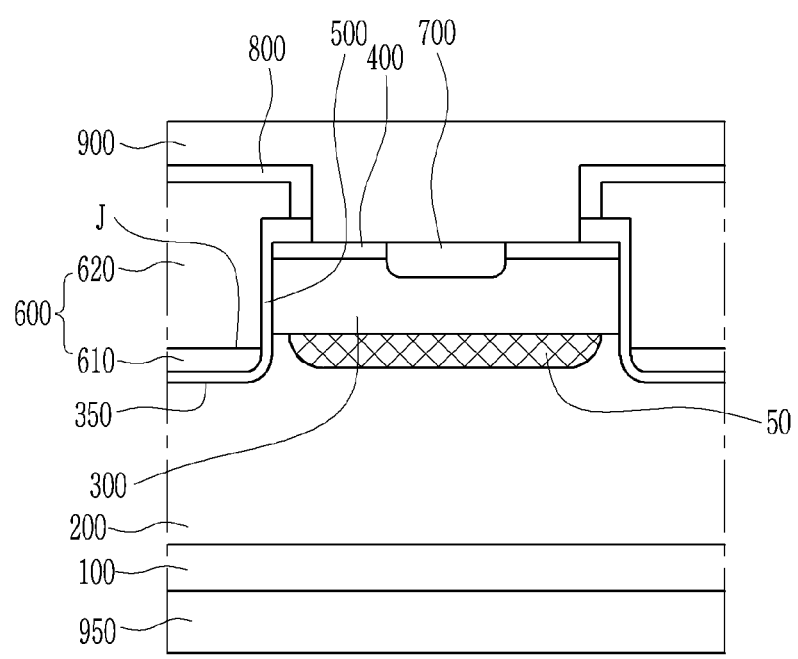
FIG. 3 is a diagram schematically illustrating an on state of the semiconductor device of FIG. 1.

FIGS. 2 and 3 are diagrams schematically illustrating an operation of the semiconductor device of FIG. 1.

FIG. 2 is a diagram schematically illustrating an off state of the semiconductor device of FIG. 1. FIG. 3 is a diagram schematically illustrating an on state of the semiconductor device of FIG. 1.

The off state of the semiconductor device is made under a condition described below.

$V_{GS} < V_{TH}, V_{DS} \geq 0V$

The on state of the semiconductor device is made under a condition described below.

$V_{GS} \geq V_{TH}, V_{DS} > 0V$

Herein, $V_{TH}$ is a threshold voltage of the MOSFET, and $V_{GS}$ is $V_G$-$V_S$, and $V_{DS}$ is $V_D$-$V_S$. $V_G$ is a voltage applied to a gate, $V_D$ is a voltage applied to a drain electrode, and $V_S$ is a voltage applied to a source electrode.

Referring to FIG. 2, in the off of the semiconductor device, a depleted layer 50 is formed so as to cover almost the n− type layer 200 to block a current path. The depleted layer 50 surrounds the lower surface and the corner of the trench 350. In the off state of the semiconductor device, an electric field is generated in the gate 600 and the p type region 300 by a voltage applied to the drain electrode 950, and the PN junction portion J present in the gate 600 distributes the electric field, so that a low electric field is applied to the gate insulating layer 500.

As described above, the electric field applied to the gate insulating layer 500 is relaxed, so that a breakdown voltage of the semiconductor device may be improved. Further, according to the relaxation of the electric field applied to the gate insulating layer 500 at a lower voltage than the breakdown voltage, durability of the gate insulating layer 500 may be improved.

Referring to FIG. 3, in the on state of the semiconductor device, the depleted layer 50 is formed in the n− type layer 200 disposed under the p type region 300. The depleted layer 50 is not formed in the n− type layer 200 adjacent to the lateral surface of the trench 350, and a channel is formed in the p type region 300 adjacent to the lateral surface of the trench 350, so that a current path is formed. That is, in the on state of the semiconductor device, electrons (e−) emitted from the source electrode 900 move to the drain electrode 950 through the n+ type region 400, the p type region 300, and the n− type layer 200.

Then, a comparison between the characteristic of the semiconductor device according to the present exemplary embodiment and a characteristic of a general semiconductor device will be described with reference to Table 1.

Table 1 represents a simulation result of the semiconductor device according to the present exemplary embodiment and a general semiconductor device.

Comparative Example 1 is a general trench gate MOSFET device, in which a gate does not include a PN junction portion. Example 1 is the semiconductor device according to FIG. 1.

In Table 1, breakdown voltages of the semiconductor device according to Example 1 and the semiconductor device according to Comparative Example 1 are compared on almost the same current density.

TABLE 1

|  | Breakdown voltage (V) | Current density (A/cm²) |
|---|---|---|
| Comparative Example 1 | 858 | 875 |
| Example 1 | 1230 | 871 |

Referring to Table 1, the breakdown voltage of the semiconductor device according to Comparative Example 1 is represented by 858 V, and the breakdown voltage of the semiconductor device according to Example 1 is represented by 1,230 V. That is, it can be seen that the breakdown voltage of the semiconductor device according to Example 1 increases by 43.4% compared to the breakdown voltage of the semiconductor device according to Comparative Example 1.

Then, a method of manufacturing the semiconductor device of FIG. 1 will be described with reference to FIGS. 4 to 8, and FIG. 1.

FIGS. 4 to 8 are diagrams schematically illustrating an example of a method of manufacturing the semiconductor device of FIG. 1.

Figure 4:
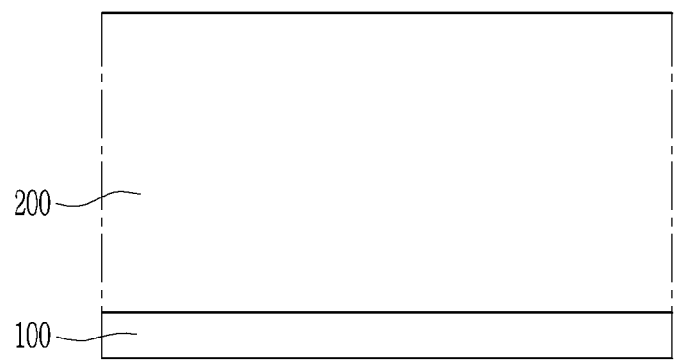
FIGS. 4 to 8 are diagrams schematically illustrating an example of a method of manufacturing the semiconductor device of FIG. 1.

Referring to FIG. 4, the substrate 100 is prepared, and the n− type layer 200 is formed on the first surface of the substrate 100. The n− type layer 200 may be formed on the first surface of the substrate 100 by epitaxial growth. Herein, the substrate 100 may be an n+ type silicon carbide substrate.

Figure 5:
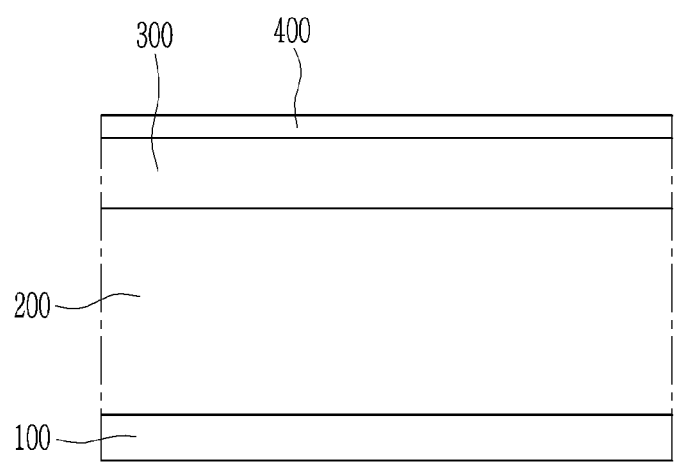

Referring to FIG. 5, the p type region 300 is formed on the n− type layer 200, and the n+ type region 400 is formed on the p type region 300. The p type region 300 may be formed by injecting p ions, such as boron (B), aluminum (Al), gallium (Ga), and indium (In), to the n-type layer 200, and the n+ type region 400 may be formed by injecting n ions, such as nitrogen (N), phosphorus (P), arsenic (As), and antimony (Sb), to the p type region 300.

However, the present invention is not limited thereto, and the p type region 300 is formed on the n− type layer 200 by epitaxial growth, and the n+ type region 400 may also be formed on the p type region 300 by epitaxial growth.

Figure 6:
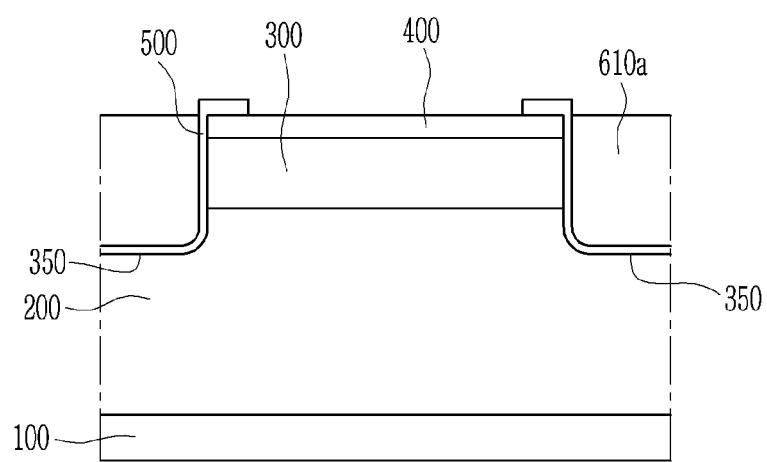

Referring to FIG. 6, the trench 350 is formed by etching the n+ type region 400, the p type region 300, and the n-type layer 200. The trench 350 penetrates the p type region 300 and the n+ type region, and is formed in the n− type layer 200.

Next, the gate insulating layer 500 is formed within the trench 350, and a first gate material layer 610a is formed on the gate insulating layer 500. The trench 350 is filled with the first gate material layer 610a, and the first gate material layer 610a may include n type poly-crystalline silicon.

Figure 7:
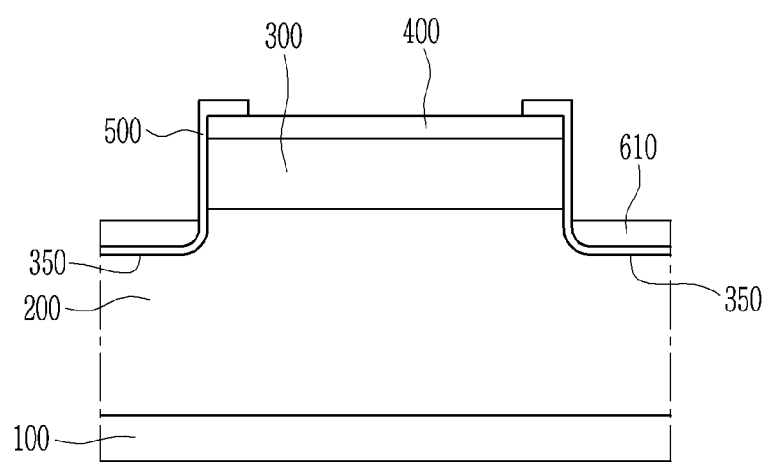

Referring to FIG. 7, the first gate 610 is formed by etching a part of the first gate material layer 610a. The first gate 610 is formed on the gate insulating layer 500 disposed in the lower surface of the trench 350. In this case, the extension line of the upper surface of the first gate electrode 610 may be disposed below the lower surface of the p type region 300.

Figure 8:
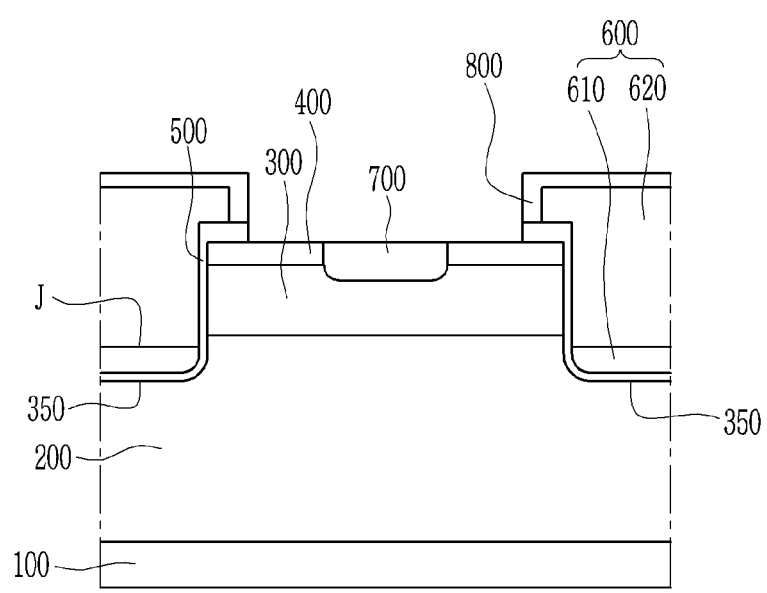

Referring to FIG. 8, the gate 600 is formed by forming the second gate 620 on the first gate 610. The second gate 620 is in contact with the first gate 610, and includes p type poly-crystalline silicon. Accordingly, the gate 600 includes the PN junction portion J. The PN junction portion J is disposed within the trench 350, and is formed in a surface, in which the first gate 610 is in contact with the second gate 620.

The trench 350 may be filled with the gate 600, and a part of the gate 600 may protrude to the outside of the trench 350.

Next, p ions, such as boron (B), aluminum (Al), gallium (Ga), and indium (In), are injected to the n+ type region 400 and the p type region 300 to form the p+ type region 700. The p+ type region 700 is spaced apart from the lateral surface of the trench 350. A concentration of the p ions contained in the p+ type region 700 is higher than a concentration of the p ions contained in the p type region 300.

Next, an oxidization film is formed on the gate 600. The oxidation film 800 may cover the lateral surface of the protruding gate 600.

Referring to FIG. 1, the source electrode 900 is formed on the n+ type region 400, the p+ type region 700, and the oxidation film 800, and the drain electrode 950 is formed on the second surface of the substrate 100.

Then, a semiconductor device according to another exemplary embodiment of the present invention will be described with reference to FIGS. 9 to 11.

Figure 9:
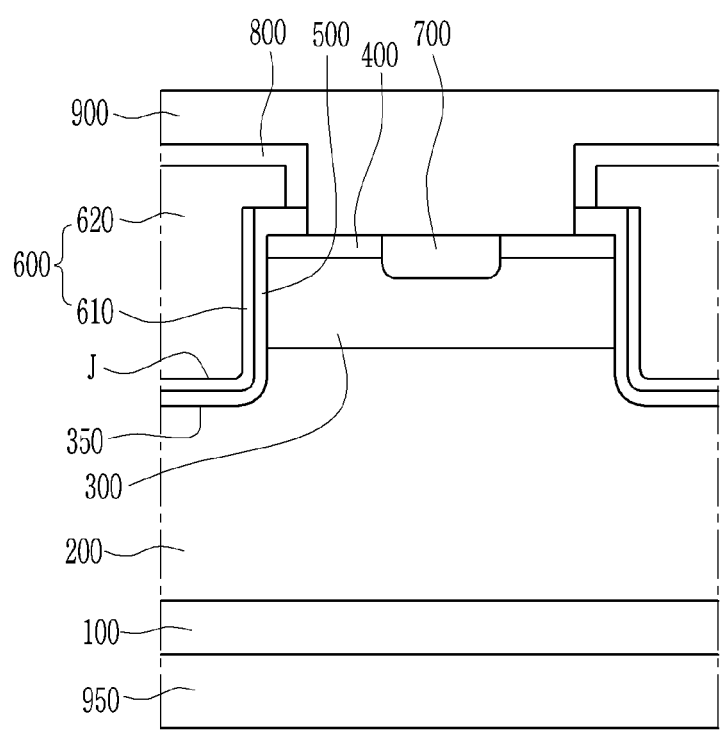
FIG. 9 is a diagram schematically illustrating an example of a cross-section of a semiconductor device according to another exemplary embodiment of the present invention.

FIG. 9 is a diagram schematically illustrating an example of a cross-section of a semiconductor device according to another exemplary embodiment of the present invention.

Referring to FIG. 9, the semiconductor device is different from the semiconductor device of FIG. 1 only in a structure of a gate 600, but the remaining structures are the same as those of the semiconductor device of FIG. 1. Accordingly, the description of the same structure will be omitted.

A gate insulating layer 500 is disposed within a trench 350, and a gate 600 is disposed on the gate insulating layer 500. The trench 350 may be filled with the gate 600, and a part of the gate 600 may protrude to the outside of the trench 350.

The gate 600 includes a first gate 610 and a second gate 620. The first gate 610 is disposed while being extended from a lateral surface to a lower surface of the trench 350, and the second gate 620 is disposed on the first gate 610 and is in contact with the first gate 610. A part of the second gate 620 may protrude to the outside of the trench 350. In this case, the first gate 610 is in contact with the gate insulating layer 500 disposed in the lower surface and the lateral surface of the trench 350. Further, a part of the first gate 610 may protrude to the outside of the trench 350 together with the second gate 620.

The first gate 610 includes n type poly-crystalline silicon, and the second gate 620 includes p type poly-crystalline silicon. Accordingly, the gate 600 includes a PN junction portion J. The PN junction portion J is disposed within the trench 350, and is formed in a surface, in which the first gate 610 is in contact with the second gate 620.

Then, a comparison between the characteristic of the semiconductor device according to the present exemplary embodiment and a characteristic of a general semiconductor device will be described with reference to Table 2.

Table 2 represents a simulation result of the semiconductor device according to the present exemplary embodiment and a general semiconductor device.

Comparative Example 1 is a general trench gate MOSFET device, in which a gate does not include a PN junction portion J. Example 2 is the semiconductor device according to FIG. 9.

In Table 2, breakdown voltages of the semiconductor device according to Example 2 and the semiconductor device according to Comparative Example 1 are compared on almost the same current density.

TABLE 2

|  | Breakdown voltage (V) | Current density (A/cm$^2$) |
| --- | --- | --- |
| Comparative Example 1 | 858 | 875 |
| Example 2 | 1098 | 871 |

Referring to Table 2, the breakdown voltage of the semiconductor device according to Comparative Example 1 is represented by 858 V, and the breakdown voltage of the semiconductor device according to Example 2 is represented by 1,098 V. That is, it can be seen that the breakdown voltage of the semiconductor device according to Example 2 increases by 28.0% compared to the breakdown voltage of the semiconductor device according to Comparative Example 1.

Then, a method of manufacturing the semiconductor device of FIG. 9 will be described with reference to FIGS. 10, 9, and 6.

Figure 10:
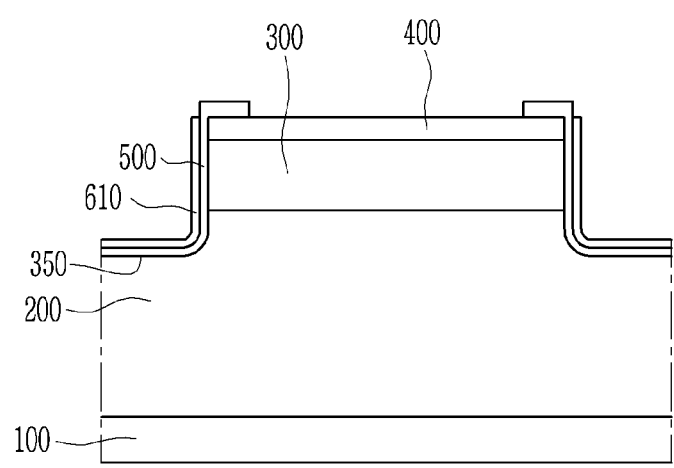
FIG. 10 is a diagram schematically illustrating an example of a method of manufacturing the semiconductor device of FIG. 9.

FIG. 10 is a diagram schematically illustrating an example of a method of manufacturing the semiconductor device of FIG. 9.

The method of manufacturing the semiconductor device of FIG. 9 is different from the method of manufacturing the semiconductor device of FIG. 1 only in a method of forming the gate 600, but the remaining methods are the same as those of the method of manufacturing the semiconductor device of FIG. 1. Accordingly, the description of the same method will be omitted.

As illustrated in FIG. 6, the trench 350 is formed by etching the n+ type region 400, the p type region 300, and the n− type layer 200, the gate insulating layer 500 is formed within the trench 350, and then the first gate material layer 610a is formed on the gate insulating layer 500. The trench 350 is filled with the first gate material layer 610a, and the first gate material layer 610a may include n type poly-crystalline silicon.

Referring to FIG. 10, the first gate 610 is formed by etching a part of the first gate material layer 610a. The first gate 610 is disposed while being extended from the lateral surface to the lower surface of the trench 350. In this case, the first gate 610 is in contact with the gate insulating layer 500 disposed in the lower surface and the lateral surface of the first gate 610.

Then, as illustrated in FIG. 9, the second gate 620 is formed on the first gate 610, and the methods of manufacturing the remaining constituent elements are the same as those of the method of manufacturing the semiconductor device according to FIG. 1.

Figure 11:
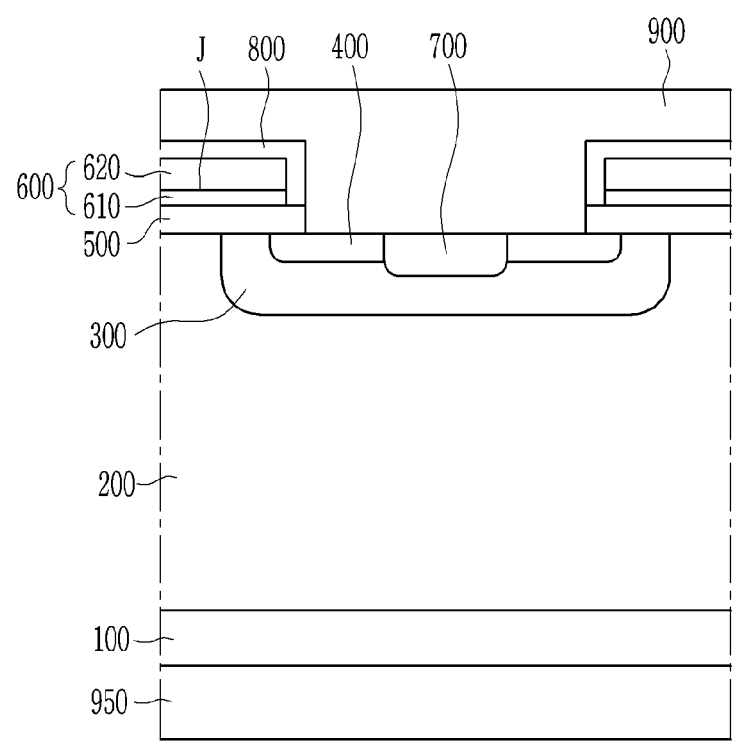
FIG. 11 is a diagram schematically illustrating an example of a cross-section of a semiconductor device according to another exemplary embodiment of the present invention.

FIG. 11 is a diagram schematically illustrating an example of a cross-section of a semiconductor device according to another exemplary embodiment of the present invention.

The semiconductor device according to the present exemplary embodiment includes a substrate 100, an n− type layer 200, a p type region 300, an n+ type region 400, a gate 600, a p+ type region 700, a source electrode 900, and a drain electrode 950. The substrate 100 may be an n+ type silicon carbide substrate.

The n− type layer 200 is disposed on a first surface of the substrate 100, and the p type region 300 is disposed on the n− type layer 200. The n+ type region 400 and the p+ type region 700 are disposed on the p type region 300. Herein, a thickness of the p+ type region 700 may be larger than a thickness of the n+ type region 400.

A gate insulating layer 500 is disposed on the n− type layer 200, the p type region 300, and the n+ type region 400, and a gate 600 is disposed on the gate insulating layer 500.

The gate 600 includes a first gate 610 and a second gate 620. A lower surface of the first gate 610 is in contact with the gate insulating layer 500, and the second gate 620 is disposed on the first gate 610 and is in contact with the first gate 610. A boundary of a lateral surface of the first gate 610 may be the same as a boundary of a lateral surface of the second gate 620.

The first gate 610 includes n type poly-crystalline silicon, and the second gate 620 includes p type poly-crystalline silicon. Accordingly, the gate 600 includes a PN junction portion J. The PN junction portion J is formed in a surface, in which the first gate 610 is in contact with the second gate 620.

An oxidation film 800 is disposed on the gate 600. The oxidation film 800 covers a lateral surface of the gate 600. That is, the oxidation film 800 is disposed on the second gate 620 and covers lateral surfaces of the first gate 610 and the second gate 620. The oxidation film 800 may include a silicon oxide (SiO$_2$).

A source electrode 900 is disposed on the n+ type region 400, the p+ type region 700, and the oxidation film 800, and a drain electrode 950 is disposed on a second surface of the substrate 100. Herein, the second surface of the substrate 100 indicates a surface opposite to the first surface of the substrate 100. The source electrode 900 and the drain electrode 950 may include ohmic metal.

As described above, the gate 600 includes the PN junction portion J, so that an electric field is distributed to the gate insulating layer 500 and the PN junction portion J of the gate 600 in an off state of the semiconductor device. Accordingly, the electric field applied to the gate insulating layer 500 is relaxed, so that a breakdown voltage of the semiconductor device may be improved. Further, according to the relaxation of the electric field applied to the gate insulating layer 500, durability of the gate insulating layer 500 may be improved.

Figure 12:
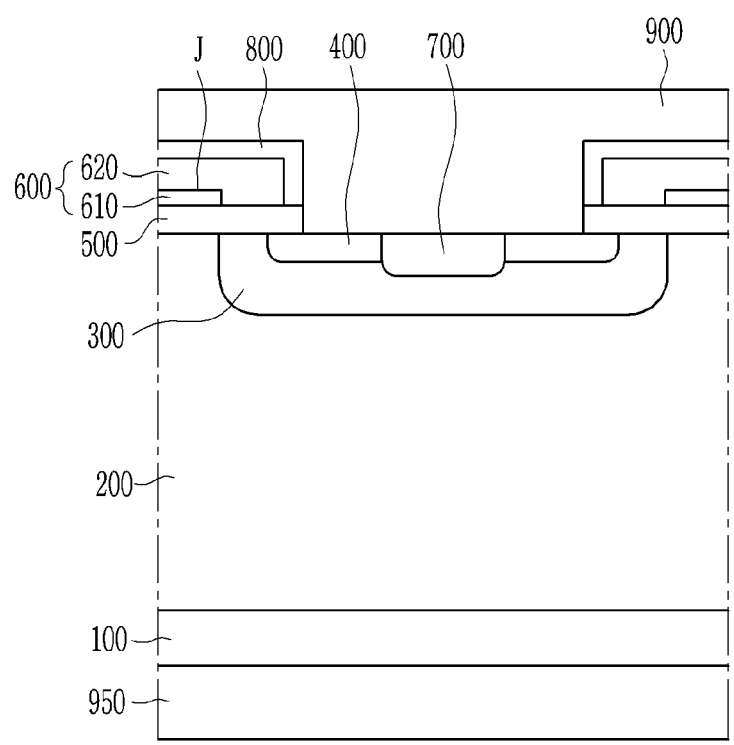
FIG. 12 is a diagram schematically illustrating an example of a cross-section of a semiconductor device according to another exemplary embodiment of the present invention.

FIG. 12 is a diagram schematically illustrating an example of a cross-section of a semiconductor device according to another exemplary embodiment of the present invention.

Referring to FIG. 12, the semiconductor device is different from the semiconductor device of FIG. 11 only in a structure of a gate 600, but the remaining structures are the same as those of the semiconductor device of FIG. 11. Accordingly, the description of the same structure will be omitted.

A gate insulating layer 500 is disposed on an n− type layer 200, a p type region 300, and an n+ type region 400, and a gate 600 is disposed on the gate insulating layer 500.

The gate 600 includes a first gate 610 and a second gate 620. A lower surface of the first gate 610 is in contact with the gate insulating layer 500, and the second gate 620 is disposed on the first gate 610 and is in contact with the first gate 610. Further, the second gate 620 covers a lateral surface of the first gate 610, and is in contact with the gate insulating layer 500.

An oxidation film 800 is disposed on the gate 600. The oxidation film 800 covers a lateral surface of the gate 600. That is, the oxidation film 800 is disposed on the second gate 620 and covers a lateral surface of the second gate 620. The oxidation film 800 may include a silicon oxide (SiO$_2$).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device, comprising:
    an n− type epitaxial layer disposed on a first surface of a substrate;
    a p type region disposed on the n− type epitaxial layer;
    an n+ type region disposed on the p type region;
    a trench disposed in the n− type layer;
    a gate insulating layer disposed within the trench;
    a gate disposed on the n− type epitaxial layer, wherein the gate includes only a first gate and a second gate, the second gate disposed on the first gate, the first gate comprising only n type poly-crystalline silicon and the second gate comprising only p type poly-crystalline silicon, wherein the first gate is in contact with the second gate to form a single a PN junction portion at an interface between the first gate and the second gate, and wherein the first gate extends from a lateral surface to a lower surface of the trench and is contact with the gate insulating layer disposed at the lower surface of the trench;
    an oxidation film disposed on the gate;
    a source electrode disposed on the oxidation film and the n+ type region; and
    a drain electrode disposed on a second surface of the substrate.

2. The semiconductor device of claim 1, wherein a boundary of a lateral surface of the first gate is the same as a boundary of a lateral surface of the second gate.

3. The semiconductor device of claim 1, wherein the second gate covers a lateral surface of the first gate.

4. The semiconductor device of claim 1, wherein an extension line of an upper surface of the first gate is disposed below a lower surface of the p type region.

5. The semiconductor device of claim 1, wherein the first gate is in contact with the gate insulating layer disposed in the lower surface and the lateral surface of the trench.

6. The semiconductor device of claim 1, further comprising:
    a trench disposed in the n− type layer; and
    a p+ type region disposed on the p type region and spaced apart from a lateral surface of the trench.

7. The semiconductor device of claim 1, wherein the substrate is an n+ type silicon carbide substrate.

8. A method of manufacturing a semiconductor device that comprises:
    an n− type epitaxial layer disposed on a first surface of a substrate;
    a p type region disposed on the n− type epitaxial layer;
    an n+ type region disposed on the p type region;
    a trench disposed in the n− type layer;
    a gate insulating layer disposed within the trench;
    a gate disposed on the n− type epitaxial layer, wherein the gate includes only a first gate and a second gate, the second gate disposed on the first gate, the first gate comprising only n type poly-crystalline silicon and the second gate comprising only p type poly-crystalline silicon, wherein the first gate is in contact with the second gate to form a single a PN junction portion at an interface between the first gate and the second gate, and wherein the first gate extends from a lateral surface to a lower surface of the trench and is contact with the gate insulating layer disposed at the lower surface of the trench;
    an oxidation film disposed on the gate;
    a source electrode disposed on the oxidation film and the n+ type region; and
    a drain electrode disposed on a second surface of the substrate;

the method comprising:
    sequentially forming the n− type epitaxial layer, the p type region, and the n+ type region on the first surface of the substrate;
    forming the trench by etching the n− type epitaxial layer, the p type region, and the n+ type region;
    forming the gate insulating layer within the trench;
    forming the gate over the gate insulating layer;
    forming the oxidation film over the gate;
    forming the source electrode on the oxidation film and the n+ type region; and
    forming the drain electrode disposed on the second surface of the substrate.

9. The method of claim 8, wherein the forming of the gate includes:
forming a gate material layer on the gate insulating layer;
forming the first gate by etching the gate material layer; and
forming the second gate on the first gate.

10. The method of claim 9, wherein forming the second gate comprises depositing the second gate on the first gate to form the PN junction portion at the interface between the first gate and the second gate.

11. The method of claim 10, wherein forming the gate material layer comprises depositing the gate material layer so that the first gate is in contact with the gate insulating layer disposed in a lower surface of the trench.

12. The method of claim 11, wherein an extension line of an upper surface of the first gate is disposed below a lower surface of the p type region.

13. The method of claim 10, wherein the first gate extends from a lateral surface to a lower surface of the trench.

14. The method of claim 13, wherein the first gate is in contact with the gate insulating layer disposed in the lower surface and the lateral surface of the trench.

15. The method of claim 8, further comprising forming a p+ type region disposed on the p type region and spaced apart from a lateral surface of the trench, the p+ type region contacting the n+ type region.

16. The method of claim 8, wherein the substrate is an n+ type silicon carbide substrate.

17. A semiconductor device, comprising:
an n− type epitaxial layer disposed on a first surface of a substrate;
a p type region disposed on the n− type epitaxial layer;
an n+ type region disposed on the p type region;
a trench disposed in the n− type layer;
a gate insulating layer disposed within the trench and along a vertically extending edge of p type region;
a p+ type region disposed on the p type region and spaced apart from a lateral surface of the trench, the p+ type region in contact with the n+ type region;
a gate disposed on the n− type epitaxial layer within the trench and extending from a bottom surface of the trench along the vertically extending edge of p type region and overlapping an upper surface of the p type region, the gate being insulated from the n− type epitaxial layer and the p type region by the gate insulating layer, wherein the gate includes an n type poly-crystalline silicon gate portion and a p type poly-crystalline silicon gate portion contacting the n type poly-crystalline silicon gate portion to form a vertical PN junction within the trench at a level that is lower than a lower surface of the p type region, wherein the gate includes only a single PN junction;
an oxidation film disposed on the gate;
a source electrode disposed on the oxidation film and the n+ type region; and
a drain electrode disposed on a second surface of the substrate.

18. The semiconductor device of claim 17, wherein the p type poly-crystalline silicon gate portion covers a lateral surface of the n type poly-crystalline silicon gate portion and a boundary of the lateral surface of the n type poly-crystalline silicon gate portion is the same as a boundary of a lateral surface of the p type poly-crystalline silicon gate portion.

19. The semiconductor device of claim 17, wherein the substrate is an n+ type silicon carbide substrate.

* * * * *